(12) United States Patent
Espina

(10) Patent No.: US 10,796,899 B2
(45) Date of Patent: Oct. 6, 2020

(54) SILICON DOPING FOR LASER SPLASH BLOCKAGE

(71) Applicant: Micron Technology, Inc., Boise, ID (US)

(72) Inventor: Angelo Oria Espina, Taichung (TW)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/235,398

(22) Filed: Dec. 28, 2018

(65) Prior Publication Data
US 2020/0211837 A1   Jul. 2, 2020

(51) Int. Cl.
*H01L 21/02* (2006.01)
*H01L 21/78* (2006.01)
*H01L 21/268* (2006.01)

(52) U.S. Cl.
CPC ...... *H01L 21/02129* (2013.01); *H01L 21/268* (2013.01); *H01L 21/78* (2013.01)

(58) Field of Classification Search
CPC . H01L 31/068; H01L 21/0206; H01L 21/223; H01L 21/266; H01L 31/022425; H01L 31/182; H01L 31/1896
USPC ................. 136/261; 438/514, 549
See application file for complete search history.

(56) References Cited

U.S. PATENT DOCUMENTS

| | | | | |
|---|---|---|---|---|
| 2006/0270161 | A1* | 11/2006 | Chen | H01L 21/266 438/275 |
| 2009/0308440 | A1* | 12/2009 | Adibi | H01L 21/26513 136/255 |
| 2012/0040490 | A1* | 2/2012 | Gallazzo | H01L 31/022425 438/87 |
| 2014/0322906 | A1* | 10/2014 | Levy | H01L 21/223 438/549 |
| 2015/0214056 | A1* | 7/2015 | Xu | H01L 21/266 438/514 |

* cited by examiner

*Primary Examiner* — Jonathan Han
(74) *Attorney, Agent, or Firm* — Perkins Coie LLP

(57) ABSTRACT

Semiconductor devices having silicon doping for laser splash protection, along with associated methods and systems, are disclosed herein. In one embodiment, a semiconductor device includes a silicon layer and a circuitry layer with a plurality of semiconductor devices. A doped silicon region is formed on a front side of the silicon layer upon which the circuitry layer is deposited. The doped silicon region is positioned under the circuitry layer. The doped silicon region has a dopant concentration of at least $10^{15}$ $cm^{-3}$.

9 Claims, 11 Drawing Sheets

US 10,796,899 B2

SILICON DOPING FOR LASER SPLASH BLOCKAGE

TECHNICAL FIELD

The present technology generally relates to doping to facilitate the separation of semiconductor devices into individual units and, more particularly, relates to silicon doping of semiconductor wafers to protect the circuitry during the dicing process.

BACKGROUND

A semiconductor device may include a plurality of semiconductor devices formed on a single substrate. Each semiconductor device on the single substrate generally comprises of a circuitry layer positioned on a silicon layer. For example, a semiconductor wafer may be processed to form a plurality of dies from a single semiconductor wafer. A top surface of the semiconductor wafer includes the circuitry layer (e.g., plurality of dies) and a bottom surface includes the silicon layer (e.g., substrate).

Various processes may be used to separate the semiconductor device into a plurality of semiconductor devices. One of these processes is stealth dicing. Stealth dicing is performed before the grinding of the backside of the semiconductor device and eventual separation of the semiconductor device into a plurality of semiconductor devices. The semiconductor device, e.g., a wafer, is initially treated using laser dicing at a specified depth in the silicon layer. The emitted radiation from the laser severs a portion of the silicon lattice of the silicon layer at specific points, creating partial regions. These partial cuts constitute fracture regions created from laser irradiation in the silicon layer. Fracture regions are created throughout the silicon layer in a pattern around the plurality of semiconductor devices. The plurality of semiconductor devices, e.g., wafer, may then be thinned to a target thickness. Under mechanical stress, the thinned plurality of semiconductor devices separates into individual units along the fracture regions.

One disadvantage of stealth dicing is that the radiating laser may damage the circuitry layer. To effectively separate semiconductor devices using stealth dicing, a higher laser energy is needed. But a high-energy laser has the potential to damage sensitive circuitry. Furthermore, high energy lasers produce unwanted scattering when focused at a particular point on the silicon material. This scattering of the high energy laser may reach the circuitry layer of the semiconductor device, causing damage to the sensitive circuitry. This unwanted scattering may be referred to as laser splashes. Damaged semiconductor circuitry from laser splashes often results in the disposal of the semiconductor device, premature failure, and other quality assurance risks.

Thus, an efficient way to prevent laser splash or unwanted scattering from a high energy laser from reaching the circuitry layer of a semiconductor device is needed.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

Figure 1:
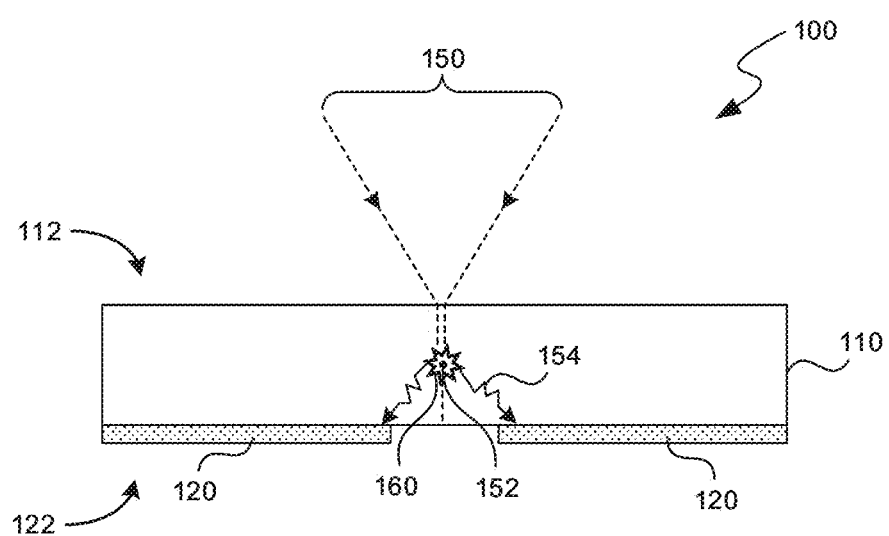
FIG. 1 shows a semiconductor device with a silicon layer and a circuitry layer undergoing stealth dicing according to one exemplary embodiment.

The various embodiments are illustrated by way of example, and not by way of limitation, in the figures of the accompanying drawings. More particular descriptions and equally effective implementations are included in this disclosure.

Identical reference numerals have been used, where possible, to designate identical elements that are common to the figures. It is contemplated that elements disclosed in one implementation may be beneficially utilized in other implementations without specific recitation.

DETAILED DESCRIPTION

Following the detailed description, reference is made to the accompanying drawings that form specific embodiments by way of illustration in which the disclosed subject matter can be practiced. However, it should be understood that other embodiments may be utilized, and structural changes may be made without departing from the scope of the disclosed subject matter. Any combination of the following features and elements is contemplated to implement and practice the disclosure.

In the description, common or similar features may be designated by common reference numbers. As used herein, "exemplary" may indicate an example, an implementation, or an aspect, and should not be construed as limiting or as indicating a preference or a preferred implementation.

Specific details of several embodiments of semiconductor devices, and associated systems and methods, are described below. The term "substrate" can refer to a wafer-level substrate or to a singulated, die-level substrate. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, plating, electroless plating, spin coating, and/or other suitable techniques. Similarly, materials can be removed, for example, using plasma etching, wet etching, chemical-mechanical planarization, or other suitable techniques. A person skilled in the relevant art will also understand that the technology may have additional embodiments, and that the technology may be practiced without several of the details of the embodiments described below with reference to FIGS. 1-11.

Numerous specific details are disclosed herein to provide a thorough and enabling description of embodiments of the present technology. A person skilled in the art, however, will understand that the technology may have additional embodiments and that the technology may be practiced without several of the details of the embodiments described below with reference to FIGS. 1-11. For example, some details of semiconductor devices and/or packages well known in the art have been omitted so as not to obscure the present technology. In general, it should be understood that various other devices and systems in addition to those specific embodiments disclosed herein may be within the scope of the present technology.

The term "semiconductor device" can refer to an assembly of one or more semiconductor devices, semiconductor device packages, and/or substrates, which may include interposers, supports, and/or other suitable substrates. The semiconductor device assembly may be manufactured as, but not limited to, discrete package form, strip or matrix form, and/or wafer panel form. The term "semiconductor device" generally refers to a solid-state device that includes a semiconductor material. A semiconductor device can include, for example, a semiconductor substrate, wafer, panel, or a single die from a wafer or substrate. A semiconductor device may refer herein to a semiconductor wafer, but semiconductor devices are not limited to semiconductor wafers.

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

FIG. 1 shows a semiconductor device with a silicon layer and a circuitry layer undergoing stealth dicing according to one exemplary embodiment. Semiconductor device 100 includes silicon layer 110 and circuitry layer 120. Silicon layer 110 includes the backside surface 112 of the semiconductor device. Circuitry layer 120 is positioned on silicon layer 110. Circuitry layer 120 includes the front surface 122 of the semiconductor device. Incoming laser beam 150 is directed towards semiconductor device 100 with a focal point 152 at a point on silicon layer 110. Incoming laser beam 150 irradiates the silicon lattice of silicon layer 110 to create fracture region 160. Incoming laser beam 150 produces laser splash 154 within the semiconductor device 100.

Silicon layer 110 may have a first thickness and circuitry layer 120 may have a second thickness with the first thickness being greater than the second thickness. In one embodiment, the first thickness is less than five times larger than the second thickness. In one embodiment, the first thickness may be approximately 22 microns and the second thickness may be approximately 6 microns. In one embodiment, the first thickness may be less than nine times as large as the second thickness.

Silicon layer 110 can be a "blank" substrate that does not include integrated circuit components and that is formed from, for example, crystalline, semi-crystalline, and/or ceramic substrate materials, such as silicon, polysilicon, aluminum oxide (Al2O3), sapphire, and/or other suitable materials. Silicon layer 110 may also include a silicon substrate, a gallium arsenide substrate, or an organic laminate substrate.

Silicon layer 110 may be a wafer including a plurality of semiconductor devices. The thickness of the wafer may range from 20 micrometers to 300 micrometers or more. Stealth dicing may be performed on a wafer without the bottom half cut. Silicon layer 110 may include materials with a small relative dielectric constant relative to silicon dioxide (low-K) or may include a high relative dielectric constant relative to silicon dioxide (non-low-K).

Circuitry layer 120 includes at least one semiconductor device. In some embodiments, circuitry layer is a wafer including a plurality of semiconductor devices. These semiconductor devices may be separated into individual units. A thin, non-functional spacing separates the functional parts of the circuitry between each of the plurality of semiconductor devices. This spacing may be called a scribe line or a saw street. The scribe line may range from anywhere between 20 micrometers wide to 110 micrometers wide. A scribe line with a width of 60 micrometers or less may undergo stealth dicing without the backside half cut. A scribe line with a width of 60 micrometers or more may undergo stealth dicing with the backside half cut.

Incoming laser beam 150 creates fracture regions (i.e., grooving or scoring) beneath the scribe line, resulting in a clean separation between the dies when silicon layer 110 is mechanically stressed. As discussed herein, the fracture regions in the circuitry layer by the laser ablation do not penetrate the entire thickness of the circuitry layer.

Circuitry layer 120 is generally sensitive to static discharge and high energy devices. Damaged semiconductor circuitry often results in the disposal of the semiconductor device or its premature failure. Circuitry layer 120 is also susceptible to chipping or cracking both before and after separation of the plurality of semiconductor devices. Chipping or cracking may be caused by stress to the silicon layer, especially during the dicing or singulation process. Incoming laser beam 150 must avoid contact with circuitry layer 120. In some embodiments, a seal ring is placed between the scribe line and the circuitry. Incoming laser beam 150 and any laser splash 154 must not go beyond the seal ring.

Circuitry layer 120 includes the front surface 122 of the semiconductor device. The front surface 122 can be an active side including one or more circuit elements (e.g., wires, traces, interconnects, transistors, etc.; shown schematically) formed in and/or on the top surface 122. The circuit elements can include, for example, memory circuits (e.g., dynamic random memory (DRAM) or other type of memory circuits), controller circuits (e.g., DRAM controller circuits), logic circuits, and/or other circuits.

Incoming laser beam 150 is capable of lasing semiconductor device 100. In particular, incoming laser beam 150 is capable of lasing the silicon layer 110. The incoming laser beam 150 is focused at or beneath the backside surface 112. The irradiation of the silicon layer 110 by the incoming laser beam 150 causes a portion of the silicon lattice to be cleaved, resulting in the fracture region 160. As discussed herein, the incoming laser beam 150 may irradiate the silicon layer 110 in a pattern. The pattern may run along the boundaries of the plurality of semiconductor devices. In some embodiments, the pattern follows the scribe lines between the plurality of dies on a semiconductor wafer. In some embodiments, the doped region 330 is formed along the pattern between the boundaries of the plurality of semiconductor devices.

The incoming laser beam 150 may have an infrared wavelength. In at least one embodiment, the wavelength of incoming laser beam 150 is 1342 nm.

Laser splash 154 is unwanted scattering from incoming laser beam 150. In some cases, silicon layer 110 may not be capable of absorbing all the energy concentrated at focal point 152. Generally, the silicon layer will absorb about 70% of the energy from incoming laser beam 150. Unabsorbed energy scatters or deflects to areas other than focal point 152. Laser splash 154 may damage the surrounding areas near the focal point 152. In some cases, laser splash 154 may pass through the silicon layer 110, damaging the circuitry layer 120. Damaged circuitry layer 120 from laser splash often results in the disposal of the semiconductor device, premature failure, and other quality assurance risks.

Fracture region 160 is created by the incoming laser beam 150. The incoming laser beam 150 may be focused substantially within the silicon layer 110. In one embodiment, fracture region 160 is created in the silicon layer adjacent to the circuitry layer 120. In another embodiment, fracture region 160 is created the lower half of the silicon layer closest to the circuitry layer 120. Fracture region 160 may be created before grinding the backside of the silicon layer 110.

The irradiation of the silicon layer 110 by the incoming laser beam 150 causes a portion of the silicon lattice of the silicon layer to be cleaved. As discussed herein, the incoming laser beam 150 may irradiate the silicon layer 110 in a pattern. The pattern is along the boundaries of the plurality of semiconductor devices. In some embodiments, the pattern follows the scribe lines between the plurality of dies on a semiconductor wafer. In some embodiments, the doped region 330 is formed along the pattern between the boundaries of the plurality of semiconductor devices.

Generally, fracture region 160 is created by the incoming laser beam 150 passing through the backside surface 112 of semiconductor device. In some embodiments, the incoming laser beam 150 passes through the front surface 122 of the semiconductor device to create fracture region 160.

Figure 2:
FIG. 2 shows another semiconductor device with a damaged silicon lattice near the fracture regions due to laser splash.

FIG. 2 shows an image of a semiconductor device with a damaged silicon lattice near the fracture regions due to laser splash. The damaged silicon lattice is located within silicon layer 110. The incoming laser beam 150 has created a series of cleavages, or fracture regions running through the silicon layer 110. As illustrated, laser splash 154 has caused damage to the silicon lattice 110. The damage to silicon lattice extends beyond the readily identifiable dark areas surrounding the series of cleavages. In some cases, the laser splash 154 damages the circuitry layer 120.

Figure 3:
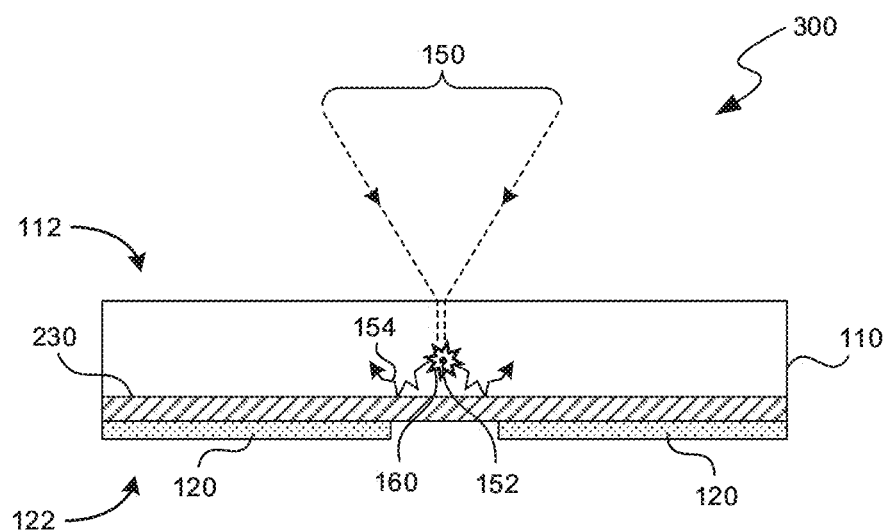
FIG. 3 shows an improved semiconductor device with a silicon layer, a doped silicon layer, and a circuitry layer undergoing stealth dicing according to one exemplary embodiment.

FIG. 3 shows an improved semiconductor device with a silicon layer, a doped silicon layer, and a circuitry layer undergoing stealth dicing according to one exemplary embodiment. Semiconductor device 200 includes silicon layer 110, circuitry layer 120, and doped region 330. Circuitry layer 120 is positioned over doped region 330, which is positioned over silicon layer 110. Circuitry layer 120 includes of the front surface 122 of the semiconductor device. Silicon layer 110 includes the backside surface 112 of semiconductor device. Incoming laser beam 150 is directed towards semiconductor device 100 with a focal point at 152. Incoming laser beam 150 irradiates the silicon lattice of silicon layer 110 to create fracture region 160. Incoming laser beam 150 produces laser splash 154 within the semiconductor device 100. Laser splash 154 is deflected or absorbed by doped region 330.

Doped region 330 is positioned between the silicon layer 110 and the circuitry layer 120. Doped region 330 is proximate to circuitry layer 120. Doped region 330 is created on the side of the silicon layer 110 upon which the circuitry layer 120 is deposited. In at least one embodiment, doped region 330 abuts the circuitry layer 120. Doped region 330 is created in silicon layer 110 before the deposition of circuitry layer 120 on silicon layer 110 in some embodiments. The doped region 330 may be selectively formed on the side of the silicon layer 110 upon which the circuitry layer 120 is deposited.

Doped region 330 is created by the silicon layer 110 absorbing certain impurities. In one embodiment, the impurity is boron. The resulting compounds include boron tribromide, boron trioxide, diborane, boron trichloride, and boron nitride. In other embodiments, the impurities are antimony, arsenic, and phosphorous. The resulting compounds include antimony trioxide, arsenic trioxide, arsine, phosphorous oxychloride, phosphorous pentoxide, and phosphine.

Doped region 230 is a protective layer against optic aberration. The incoming laser beam 150 may not converge at one focal point because of limitations or defects in the optics of the laser. As a result, laser splash 154 from the light beam may strike the silicon layer 110 at a point dangerously close to the active circuitry 220. The silicon layer 110 may not be able to absorb the stray light. The doped region 330 shields the active circuitry by deflecting and absorbing laser splash 154.

Doped region 330 is capable of deflecting laser splash 154. The doping in doped region 230 changes the optic properties of the silicon layer 110. The amount of impurities introduced into the doped region 330 changes the index of refraction. The higher the dopant concentration, the higher the index of refraction of doped region 330. Changing the index of refraction deflects laser splash 154 away from the surface of the doped region 330.

Doped region 330 is capable of absorbing laser splash 154. The doping in doped region 230 changes the absorptive properties of the silicon layer 110. The amount of impurities introduced into the doped region 330 changes the transmission of light through the doped region 330 in some embodiments. The higher the dopant concentration, the less light that passes through doped region 330. Increasing the dopant concentration in doped region 330 results in more absorption of laser splash 154 by the doped region 330. Laser splash 154 will not traverse the doped region 330 to reach the circuitry layer 120 with high dopant concentration. Thus, laser splash impingement on the circuitry layer 120 is avoided.

Figure 4:
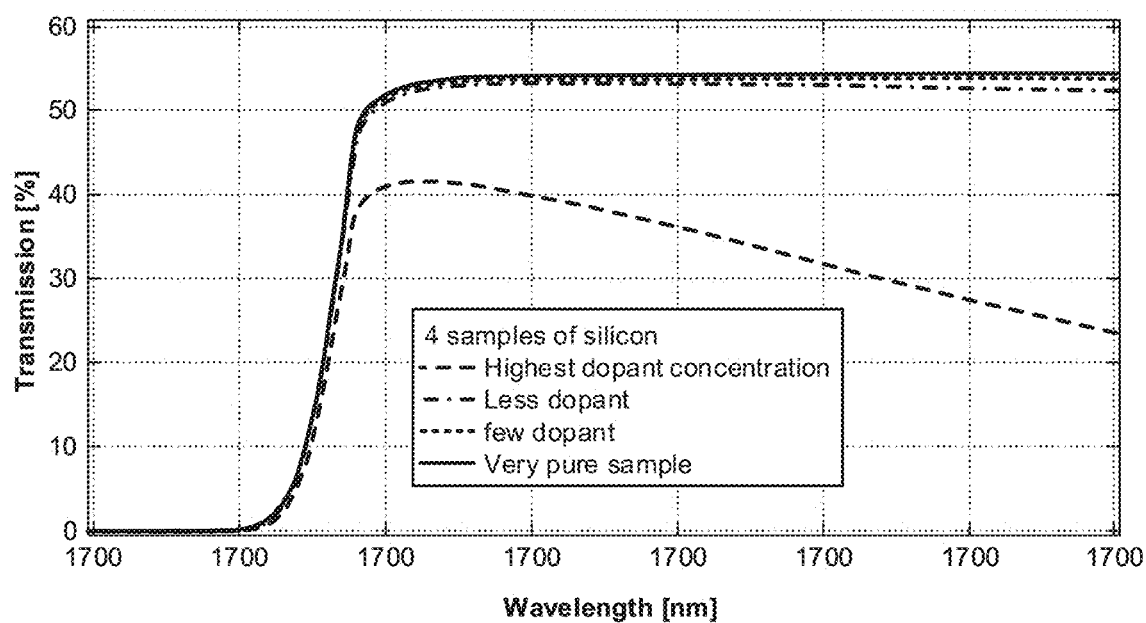
FIG. 4 shows a graph of the transmission of light as a percentage versus wavelength for various samples of silicon.

FIG. 4 shows a graph of the transmission of light as a percentage versus wavelength for various samples of silicon. Laser splash 154 may be absorbed by doped region 230. As illustrated in the graph, a higher dopant concentration results in a lower percentage of light transmission.

Figure 5A:
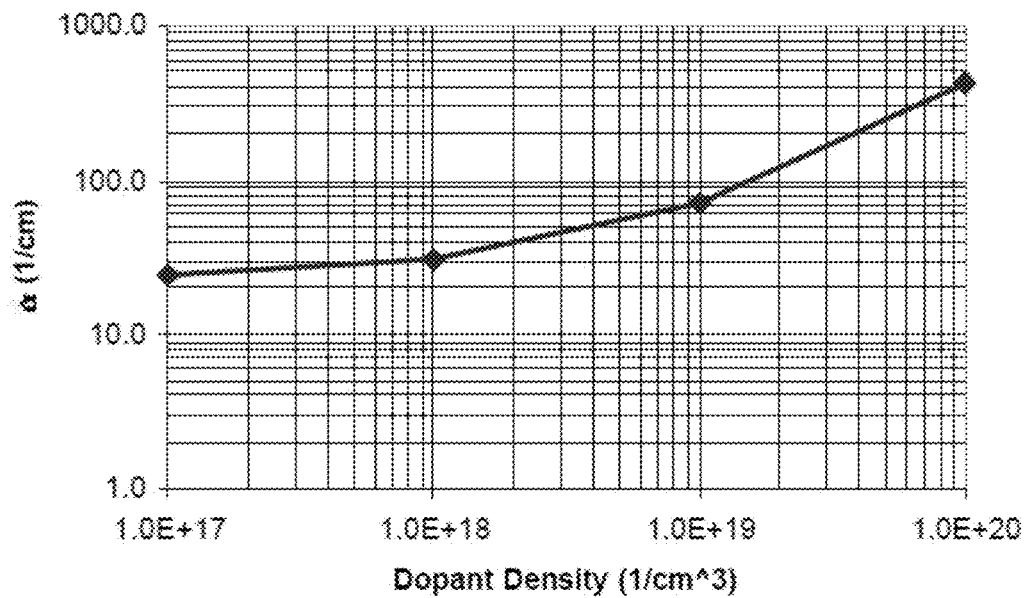
FIG. 5A shows a graph of the absorption coefficient versus p-dopant density for a wavelength of 1064 nm.

FIG. 5A shows a graph of the absorption coefficient versus p-dopant density for a wavelength of 1064 nm. In some embodiments, the p-dopant density is at least $10^{15}$ $cm^{-3}$. The p-dopant density is $10^{18}$ $cm^{-3}$ in at least one embodiment.

Figure 5B:
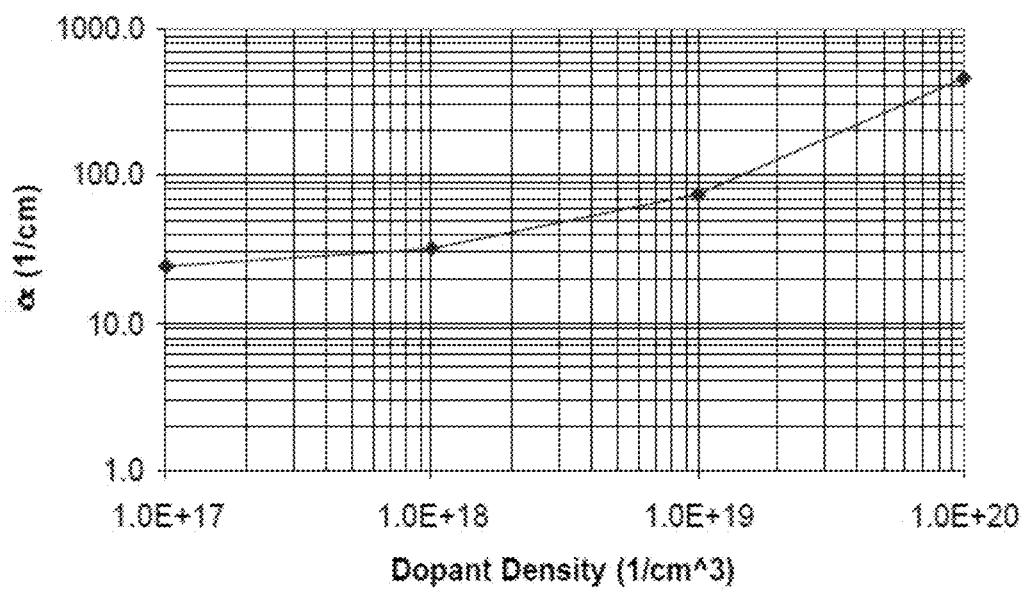
FIG. 5B shows a graph of the absorption coefficient versus n-dopant density for a wavelength of 1064 nm.

FIG. 5B shows a graph of the absorption coefficient versus n-dopant density for a wavelength of 1064 nm. In some embodiments, the n-dopant density is at least $10^{15}$ cm$^{-3}$. The n-dopant density is $10^{18}$ cm$^{-3}$ in at least one embodiment.

Figure 6:
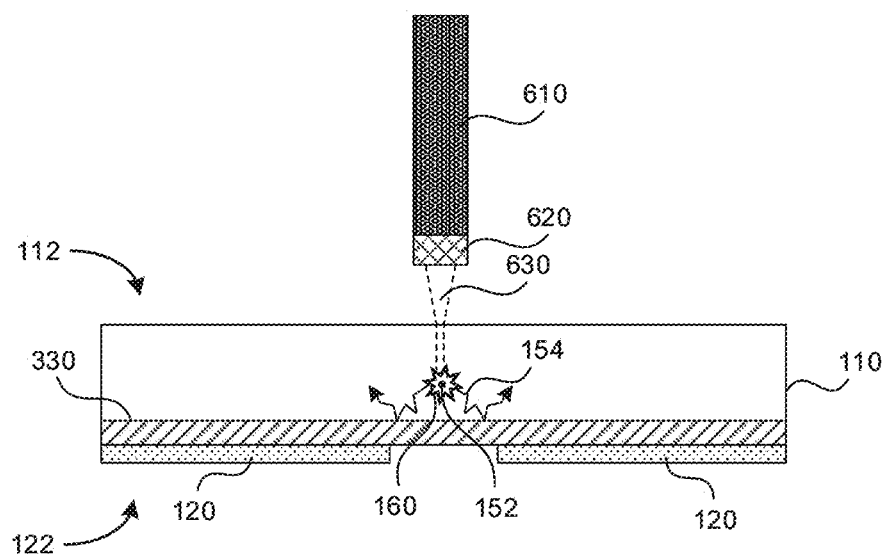
FIG. 6 shows a laser performing stealth dicing on another improved semiconductor device according to one exemplary embodiment.

FIG. 6 shows is a laser performing stealth dicing on another improved semiconductor device according to one exemplary embodiment. Laser 300 includes laser source 610 and laser optics 620. Laser source 610 passes a light beam through laser optics 620 to focus on an area within the silicon layer. The focused laser beam 630 may be adjusted by laser optics 620, displacing the irradiated location in the silicon layer 110.

Laser source 610 generates a high energy laser beam capable of cleaving the silicon lattice to create fracture region 160. The laser source may generate a laser beam having a wavelength between 1000 nm and 1400 nm. In one embodiment, the laser source generates a laser beam having a wavelength of 1342 nm.

Focused laser beam 630 has the ability to focus at a particular depth in silicon layer 110. The laser 600 may utilize multiphoton absorption in order to form a modified region within the silicon layer 110. A material becomes optically transparent if its absorption bandgap E is greater than a photon energy hV. The condition under which absorption occurs in the material is hVE. However, the material yields absorption under the condition of nhv>E where n=2,3,4 even when the material is optically transparent.

Focused laser beam 630 may emit pulse waves. In the case of pulse waves, the intensity of laser light is determined by the peak power density (W/cm) of laser light at a light-converging point thereof. The multiphoton absorption occurs, for example, at a peak power density (W/cm) of 1×10 (W/cm) or higher. The peak power density is determined by (energy per pulse of laser light at the light-converging point)/(laser light beam spot cross-sectional area x pulse width). In the case of a continuous wave, the intensity of laser light is determined by the electric field strength (W/cm) of laser light at the light-converging point.

Laser splash 154 may be triggered by a variety of failure mechanisms of the laser itself. For instance, laser splash may be the result of an off-centered laser beam. Machines generating a laser beam without an LBA centering function tend to cause this failure mode. In other cases, an unoptimized stealth dicing recipe may cause sporadic laser splash 154. Creating an optimized recipe may require several trials to get the optimized wafer yield. Optimized recipes may also require frequent calibration of the machine. In at least one embodiment, laser splash was controlled at a power setting of 0.7 W.

Laser machine conditions vary such that an unoptimized condition could potentially cause laser splash 154 in the future. Even optimized recipes could see early signs of failure by laser splash 154 if pushed to large-scale manufacturing or processing extremes. Thus, optimized recipes and conditions may be insufficient to prevent circuitry damage resulting from laser splash 154

Laser optics 320 may adjust the laser beam source 310 to focus at various depths within the silicon layer 110. Laser optics 320 may focus laser beam source 310 in a plurality of locations. For example, laser optics 320 may produce two focal points within silicon layer 110 to facilitate simultaneous multipoint processing of the silicon layer 110. This method is advantageous with thicker wafers.

Figure 7:
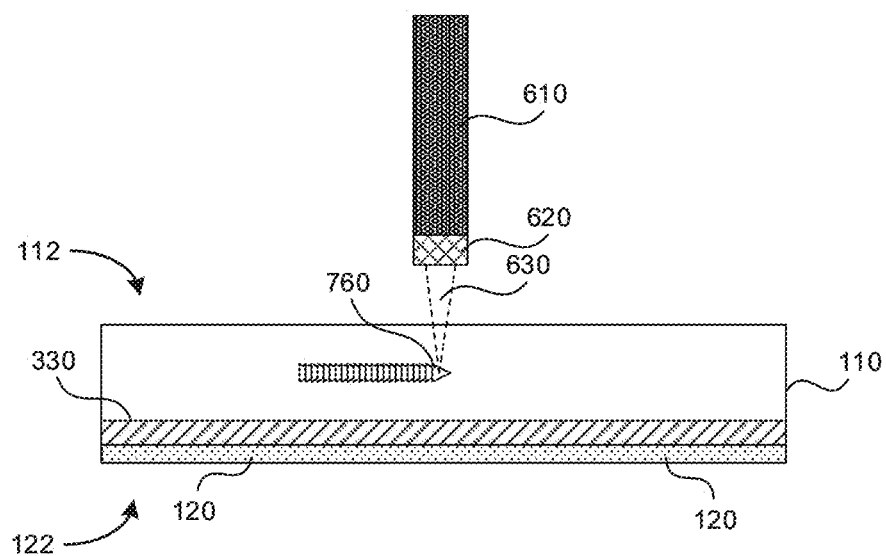
FIG. 7 shows a lateral view of a laser performing stealth dicing on another improved semiconductor device to create fracture regions according to one exemplary embodiment.

FIG. 7 shows a lateral view of a laser performing stealth dicing on an improved semiconductor device to create fracture regions according to one exemplary embodiment. Laser source 610 passes a light beam through laser optics 620 to focus on an area within the silicon layer 110. The focused laser beam 630 may be adjusted by laser optics 620, displacing the irradiated location in the silicon layer 110. The focused laser beam 630 created a series of cleavages or multiple fracture regions 760 in silicon layer 110.

The focused laser beam 630 may irradiate the silicon layer in a pattern. The pattern may run along the boundaries of the plurality of semiconductor devices. In some embodiments, the pattern follows the scribe lines between the plurality of dies on a semiconductor wafer. In some embodiments, the doped region 330 is formed along the pattern between the boundaries of the plurality of semiconductor devices.

Multiple fracture regions 760 run along a separation line within the silicon layer 110. The focused laser beam 630 creates multiple fracture regions 360 along the separation line, corresponding to where the semiconductor device will be divided. The separation line may be formed in the scribe line or saw street between the plurality of semiconductor devices. After the desired separation lines have been formed, the portions of the wafer can be separated with any suitable method, such as tape expansion or cracking by bending.

Multiple fracture regions 760 are created by the focused laser beam 630 entering through the backside surface 112 of the semiconductor device. In at least one embodiment, the multiple fracture regions 760 may be created by the focused laser beam 630 entering through the front surface 122 of the semiconductor device. In at least one embodiment, the multiple fracture regions 760 are created by the focused laser beam 630 entering through both the backside surface 112 and the front surface 122 of the semiconductor device.

Doped region 330 may be continuous as depicted. Doped region 330 may be selectively formed beneath multiple fracture regions 760. In at least one embodiment, doped region 330 is selectively formed underneath the plurality of semiconductor devices. Doped region 330 may be selectively formed across an entire wafer except beneath the scribe lines.

Figure 8:
FIG. 8 shows another semiconductor device containing fracture regions in the silicon lattice with no laser splash damage.

FIG. 8 shows another semiconductor device containing multiple fracture regions in the silicon lattice with no laser splash damage.

Figure 9:
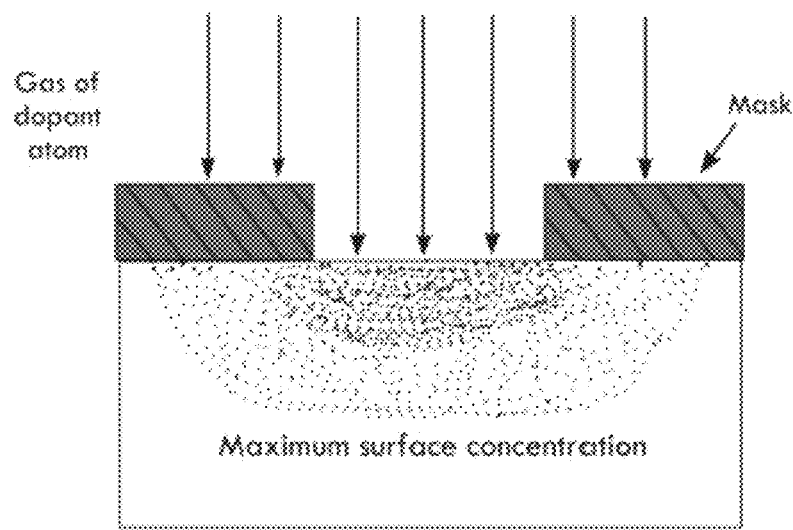
FIG. 9 shows a method of doping a silicon layer according to one exemplary embodiment.

FIG. 9 shows a method of doping a silicon layer according to one exemplary embodiment. Doped region 330 may be created by thermal diffusion. Thermal diffusion is a two-step process comprising of deposition (introducing dopant atoms at the wafer surface) and drive-in (dopant atoms diffuse into the wafer to create the required concentration).

The type of dopant determines the delivery method for deposition. For a liquid source, a carrier gas is usually used to transport the vapors to the diffusion furnace. For solid sources, wafer-sized slugs are packed into the furnace along with the product wafers. Another option is to spin on the oxide source on the wafer surface using a suitable solvent. A solid source may be vaporized in a neighboring furnace and to use a carrier gas to transport the vapors to the wafer. A mask may be applied to designate the desired regions of doping.

Figure 10A:
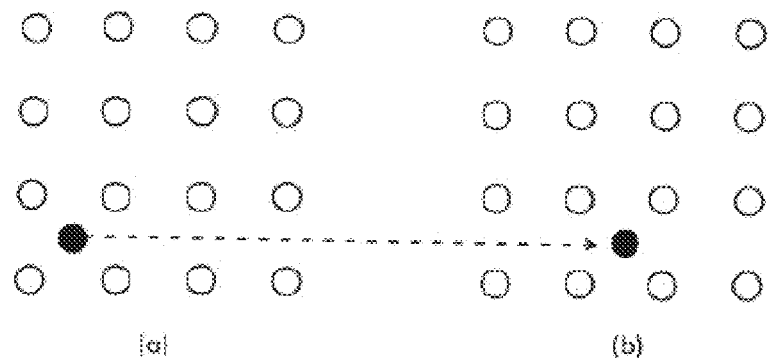
FIG. 10A shows an interstitial diffusion mechanism illustrating the motion of a dopant atom from a first position to a second position according to one exemplary embodiment.

Once the dopant atoms have arrived on the wafer surface, they need to be redistributed into the bulk silicon. The drive-in process can either be carried out through substitutional diffusion or interstitial diffusion. FIG. 10A shows an interstitial diffusion mechanism illustrating the motion of dopant atom from a first position to a second position according to one exemplary embodiment. Interstitial diffusion is carried out when the dopant atom is smaller than the silicon atom. Rapid thermal procession may be applied to the wafer to cultivate interstitial diffusion until the desired concentration of impurities is reached.

Figure 10B:
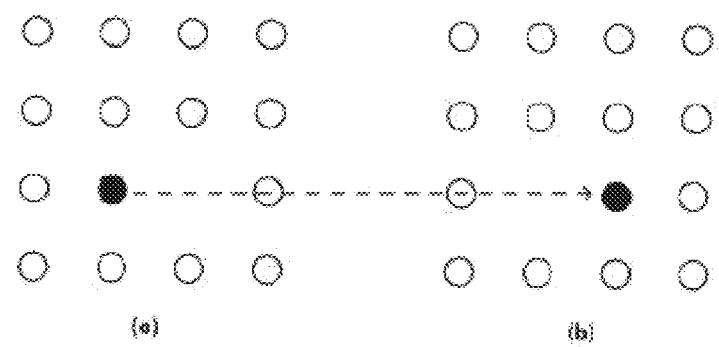
FIG. 10B shows a substitutional diffusion mechanism illustrating the motion of a dopant atom from a first position to a second position according to one exemplary embodiment.

FIG. 10B shows a substitutional diffusion mechanism illustrating the motion of dopant atom from a first position to a second position according to one exemplary embodiment. Substitutional diffusion occurs when the dopant size is comparable to the silicon atom. Rapid thermal procession may be applied to the wafer to cultivate substitutional diffusion until the desired concentration of impurities is reached.

Figure 11:
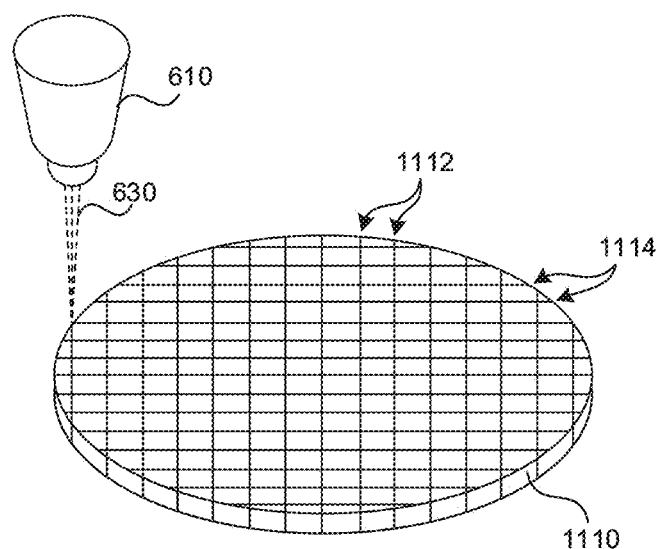
FIG. 11 shows a laser performing stealth dicing on a plurality of semiconductor devices according to one exemplary embodiment.

FIG. 11 shows a laser performing stealth dicing on a plurality of semiconductor devices according to one exemplary embodiment. The plurality of semiconductor devices may be semiconductor wafer 1110. Semiconductor wafer 1110 includes a pattern across the surface. The laser ablation of the silicon layer may be done in grid pattern 1112. That is, the silicon lattice is cleaved along grid pattern 1112 lattice in order to separate the semiconductor wafer into individual semiconductor devices or dies.

Doped region 330 may be formed corresponding to the grid pattern 1112. Each doped region 330 may correlate to a semiconductor device or die. In some embodiments, the doped region is beneath the semiconductor device or die. The doped region 330 may be absent along scribe lines in the grid pattern. In some embodiments, the doped region 330 is formed along the pattern between the boundaries of the plurality of semiconductor devices.

The doped region 330 may be created in the areas most susceptible to laser splash 154. For instance, the doped region 330 is formed in the surrounding areas or borders of the scribe lines 1114. The method of creating doped region 330 may place masks correlating to areas less susceptible to laser splash 154 and open exposure for dopant diffusion in areas more susceptible to laser splash 154.

Any of the semiconductor devices having the features described above with reference to FIGS. 1-11 can be incorporated into any of a myriad of larger and/or more complex systems. The system can include a processor, a memory (e.g., SRAM, DRAM, flash, and/or other memory devices), input/output devices, and/or other subsystems or components. The resulting system can be configured to perform any of a wide variety of suitable computing, processing, storage, sensing, imaging, and/or other functions. Accordingly, representative examples of the system include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system include lights, cameras, vehicles, etc. With regard to these and other examples, the system can be housed in a single unit or distributed over multiple interconnected units, e.g., through a communication network. The components of the system can accordingly include local and/or remote memory storage devices and any of a wide variety of suitable computer-readable media.

From the foregoing, it will be appreciated that specific embodiments of the technology have been described herein for purposes of illustration, but that various modifications may be made without deviating from the disclosure. Accordingly, the invention is not limited except as by the appended claims. Furthermore, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described, and other implementations, enhancements and variations can be made based on what is described and illustrated in this patent document.

The illustrations of embodiments described herein are intended to provide a general understanding of the structure of various embodiments, and they are not intended to serve as a complete description of all the elements and features of components and systems that might make use of the structures described herein. Many other embodiments will be apparent to those of ordinary skill in the art upon reviewing the description provided herein. Other embodiments may be utilized and derived, such that structural and logical substitutions and changes may be made without departing from the scope of this disclosure. The figures herein are merely representational and may not be drawn to scale. Certain proportions thereof may be exaggerated, while others may be minimized. Accordingly, the specification and drawings are to be regarded in an illustrative rather than a restrictive sense.

Some embodiments implement functions in two or more specific interconnected hardware modules or devices with related control and data signals communicated between and through the modules, or as portions of an application-specific integrated circuit. Thus, the example system is applicable to software, firmware, and hardware implementations.

The abstract of the disclosure is provided to allow the reader to quickly ascertain the nature of the technical disclosure. It is submitted with the understanding that it will not be used to interpret or limit the scope or meaning of the claims. In addition, in the foregoing detailed description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the detailed description, with each claim standing on its own as a separate embodiment.

While the foregoing is directed to implementations of the present disclosure, other and further implementations of the disclosure may be devised without departing from the basic scope thereof, and the scope thereof is determined by the claims that follow.

I claim:

1. A method of dicing a silicon substrate, the method comprising:

applying a mask to a front side of the silicon substrate, wherein the mask includes one or more openings exposing one or more regions to be doped;

introducing dopant atoms at the one or more regions;

diffusing the dopant atoms into the one or more regions using a rapid thermal procession until the one or more regions have a dopant concentration of at least $10^{15}$ cm$^{-3}$;

forming an active layer of circuitry at the front side of the substrate;

stealth dicing the substrate from a back surface thereof using laser irradiation to cleave one or more portions of a silicon lattice of the substrate, the one or more portions being vertically aligned with the one or more regions; and back-grinding the back surface of the substrate to mechanically separate adjacent semiconductor dice from the substrate on opposing sides of the one or cleaved more portions of the silicon lattice of the substrate, wherein the dopant concentration of the one or more regions is configured to absorb a laser splash from the stealth dicing or to reflect the laser splash away from the active layer of circuitry.

2. The method of claim 1, wherein the mask aligns with scribe lines between a plurality of semiconductor devices of a circuitry layer.

3. The method of claim 1, wherein the mask aligns with a plurality of semiconductor devices of a circuitry layer.

4. The method of claim 1, wherein the mask is only applied to a surrounding border adjacent to a plurality of scribe lines.

5. The method of claim 1, wherein the dopant concentration comprises boron impurities.

6. The method of claim 1, wherein the dopant concentration comprises phosphorous impurities.

7. The method of claim 1, wherein the dopant concentration is based on a desired index of refraction for the doped silicon region.

8. The method of claim 1, wherein the dopant concentration is based on a desired light transmissivity for the doped silicon region.

9. The method of claim 1, wherein the dopant concentration is based on an ability of the doped silicon region absorb a laser splash containing a wavelength of about 1000-1342 nm.

* * * * *